(12) United States Patent
Rossi et al.

(10) Patent No.: US 7,141,486 B1
(45) Date of Patent: Nov. 28, 2006

(54) SHALLOW TRENCH ISOLATION STRUCTURES COMPRISING A GRADED DOPED SACRIFICIAL SILICON DIOXIDE MATERIAL AND A METHOD FOR FORMING SHALLOW TRENCH ISOLATION STRUCTURES

(75) Inventors: Nace Rossi, Singapore (SG); Ranbir Singh, Singapore (SG); Arun K. Nanda, Singapore (SG)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/153,893

(22) Filed: Jun. 15, 2005

(51) Int. Cl.
*H01L 21/76* (2006.01)

(52) U.S. Cl. ............ 438/424; 438/400; 438/221; 257/E21.549

(58) Field of Classification Search ........ 438/424–427, 438/400, 221; 257/E21.549
See application file for complete search history.

(56) References Cited

U.S. PATENT DOCUMENTS

| | | | |
|---|---|---|---|
| 3,887,404 A * | 6/1975 | Chane | 438/704 |
| 4,341,010 A * | 7/1982 | Tijburg et al. | 438/40 |
| 4,571,819 A | 2/1986 | Rogers et al. | |
| 5,838,055 A | 11/1998 | Kleinhenz et al. | |
| 6,235,456 B1 * | 5/2001 | Ibok | 430/512 |
| 6,355,567 B1 * | 3/2002 | Halle et al. | 438/700 |
| 6,514,805 B1 * | 2/2003 | Xu et al. | 438/164 |
| 6,566,226 B1 | 5/2003 | Hatanaka | |
| 6,825,544 B1 | 11/2004 | Jin | |
| 6,828,646 B1 | 12/2004 | Marty et al. | |
| 6,849,919 B1 | 2/2005 | Sumino et al. | |
| 2002/0037627 A1 * | 3/2002 | Liu et al. | 438/424 |
| 2002/0055231 A1 * | 5/2002 | Clampitt | 438/259 |
| 2003/0003681 A1 * | 1/2003 | Xu et al. | 438/424 |
| 2005/0085056 A1 * | 4/2005 | Lai et al. | 438/526 |
| 2005/0133828 A1 * | 6/2005 | Hsiao et al. | 257/244 |

* cited by examiner

*Primary Examiner*—George R. Fourson
*Assistant Examiner*—John M. Parker (57) ABSTRACT

A shallow trench isolation structure having a negative taper angle. A graded doped sacrificial layer is formed over a semiconductor substrate and etched to form a first trench therein having trench sidewalls that present a negative taper angle. The substrate is also etched to form a second trench therein overlying the first trench. Silicon dioxide fills both the first and the second trenches to form the shallow trench isolation structure, with the silicon dioxide in the first trench exhibiting a negative taper angle to avoid formation of polysilicon stringers during a gate polysilicon deposition.

25 Claims, 7 Drawing Sheets

FIG. 1

(PRIOR ART)

FIG. 2

(PRIOR ART)

DOPING CONCENTRATION

SHALLOW TRENCH ISOLATION STRUCTURES COMPRISING A GRADED DOPED SACRIFICIAL SILICON DIOXIDE MATERIAL AND A METHOD FOR FORMING SHALLOW TRENCH ISOLATION STRUCTURES

FIELD OF THE INVENTION

The present invention relates generally to integrated circuits and more particularly to a method for forming a shallow trench isolation (STI) structure within an integrated circuit, wherein the shallow trench isolation structure comprises a graded doped silicon dioxide material, and further to a shallow trench isolation structure comprising graded doped silicon dioxide material.

BACKGROUND OF THE INVENTION

Integrated circuits (or chips) typically comprise a silicon substrate and semiconductor devices, such as transistors, formed from doped regions within the substrate. Interconnect structures disposed in parallel-like layers overlying the semiconductor substrate provide electrical connection between doped regions to form electrical devices and circuits. A conventional interconnect system comprises a plurality of substantially vertical conductive vias or plugs interconnecting substantially horizontal conductive traces, with a dielectric layer disposed between two vertically adjacent horizontal conductive traces.

Within an integrated circuit substrate it may be necessary to isolate certain doped regions to avoid the effects of parasitic devices that are formed by interaction of doped regions. For example, in a CMOSFET device (complimentary metal-oxide semiconductor field effect device) comprising n-channel and p-channel metal-oxide semiconductor field effect transistors (MOSFETS) formed in oppositely doped adjacent wells, a parasitic bipolar structure, i.e., a p-n-p-n thyristor, is inadvertently formed. Although the thyristor is off under normal operating conditions, if the isolation between doped regions is not sufficient, under certain bias conditions the p-n-p regions can supply base current to the n-p-n regions, causing a large current leakage between adjacent MOSFETS that can latch-up the CMOS device.

A thick oxide region, whether formed according to a local oxidation of silicon (LOCOS) process or an STI process as described below, electrically isolates adjacent transistors and other devices to minimize current therebetween and reduce these parasitic effects. The local oxidation of silicon process forms recessed LOCOS isolation regions in a non-active area (also referred to as a field region) of the semiconductor substrate. For example, LOCOS regions are formed in an area between the p-channel and n-channel devices of a CMOS device. According to a one LOCOS process, a layer of silicon nitride is deposited over the substrate and patterned according to conventional masking and etching steps to form openings that expose underlying substrate silicon. The isolating LOCOS regions are formed by oxidizing the exposed silicon through the openings. No oxidation occurs in the masked regions.

Shallow trench isolation enjoys certain advantages over the LOCOS method. An STI structure comprises a dielectric-filled substrate trench that electrically isolates doped regions of active devices, including CMOS devices, MOSFETS and bipolar transistors. STI is an important technology for device sizes below about 0.25 microns, as the trenches consume a smaller surface area and exhibit a flatter upper surface topology than the LOCOS structures. Since the shallow trench isolation structure consumes less substrate surface than the LOCOS structure, more transistors per unit area can be fabricated in an integrated circuit employing STI isolation techniques. STI structures also provide superior isolation because sharp corners at the bottom of the STI trench form voltage barriers that tend to block leakage currents between adjacent doped regions. LOCOS regions generally present rounded corners and thus may permit some leakage current. STI trenches are typically about 3000 Angstroms deep.

As is known, a plurality of integrated circuits are fabricated in a semiconductor wafer, each integrated circuit comprising doped regions formed in a wafer substrate, with dielectric layers and conductive interconnect layers formed over an upper surface of the substrate. FIGS. 1–6 are cross-sectional views, not drawn to scale, illustrating successive prior art processing steps across a common plane for forming a shallow trench isolation structure in a substrate of one integrated circuit of the plurality of integrated circuits.

Figure 1:
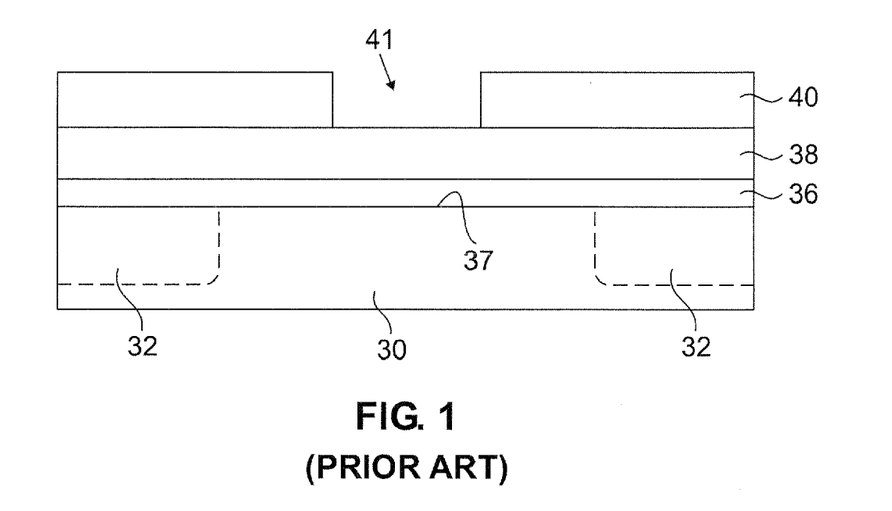
FIGS. 1–6 are cross-sectional views of a substrate during successive processing steps to form a prior art shallow trench isolation structure.
Figure 2:
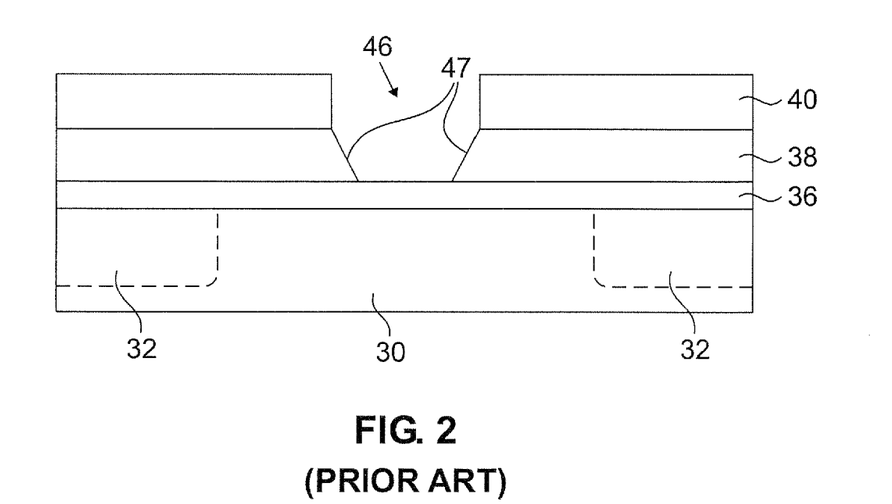

A semiconductor substrate 30 in FIG. 1 comprises active devices formed within doped regions depicted generally by a reference character 32. It is desired to isolate these doped regions with a shallow trench isolation structure therebetween. A stress-reducing silicon dioxide layer 36 (also referred to as a pad oxide layer 36) is deposited or grown over an upper surface 37 of the substrate 30. Next, a silicon nitride layer 38 is deposited overlying the silicon dioxide layer 36. As is known, the silicon nitride layer 38 imposes stresses on the substrate 30, with the stresses increasing with increasing thickness of the silicon nitride layer. The pad oxide layer 36 isolates the substrate 30 from the silicon nitride layer 38 to reduce these stresses.

A photoresist layer 40 is deposited, exposed and developed according to known processes to form an opening 41 therein.

Using the photoresist layer 40 as an etch mask, an opening 46 (see FIG. 2) is etched in the silicon nitride layer 38, preferably using a plasma etching process. During the etching process, sidewalls 47 of the opening 46 are formed with a positive taper angle.

Figure 3:
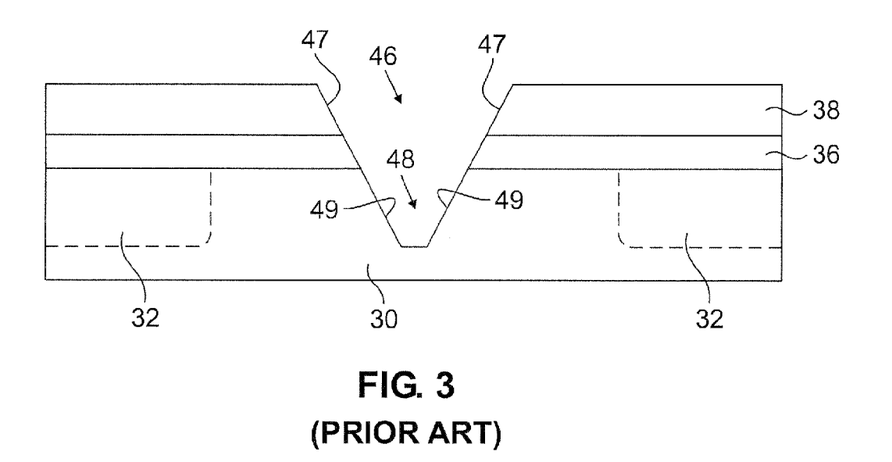
Figure 4:
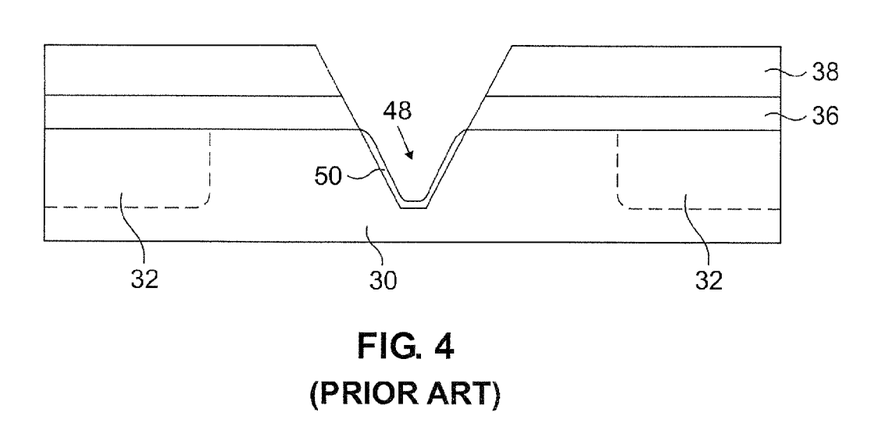

The photoresist layer 40 is removed and the wafer is cleaned. As shown in FIG. 3, a trench 48 is formed in the silicon dioxide layer 36 and the silicon substrate 30 during an etching step that uses the opening 46 as a mask. The positive taper angle in the sidewalls 47 of the opening 46 creates a positive taper angle in sidewalls 49 of the trench 48.

A trench silicon dioxide liner 50 is then formed or deposited in the trench 48. See FIG. 4.

Figure 5:
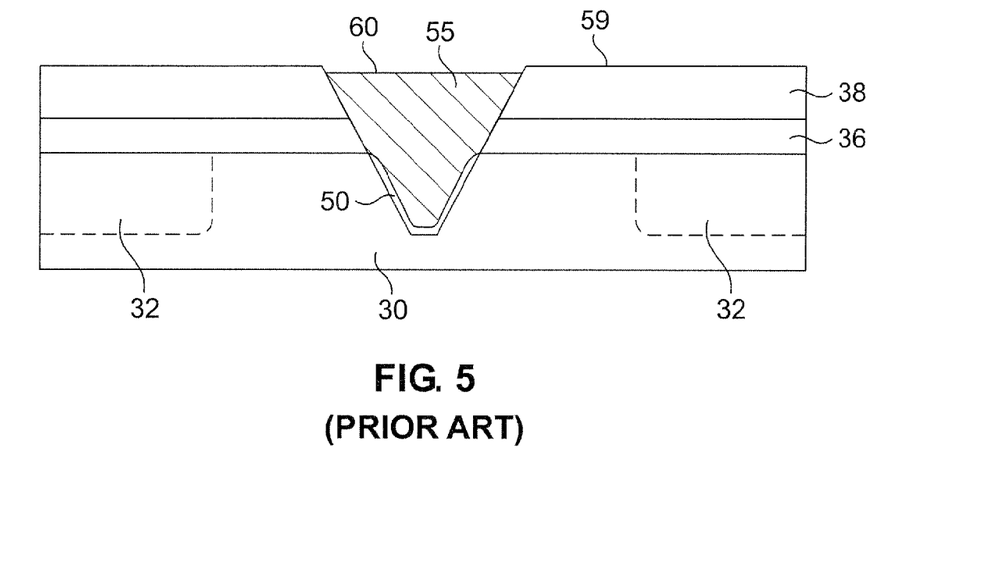

As illustrated in FIG. 5, a shallow trench isolation (STI) structure 55 is formed within the trench 48 according to a silicon dioxide deposition step (e.g., a high density plasma oxide deposition), during which silicon dioxide is also deposited on an upper surface 59 of the silicon nitride layer 38. A chemical-mechanical polishing (CMP) step removes the silicon dioxide from the upper surface 59, stopping on the silicon nitride layer 38. Since the CMP polishing rate for silicon dioxide is different than the CMP polishing rate for silicon nitride, an upper surface 60 of the STI structure 55 is recessed below the upper surface 59.

Figure 6:
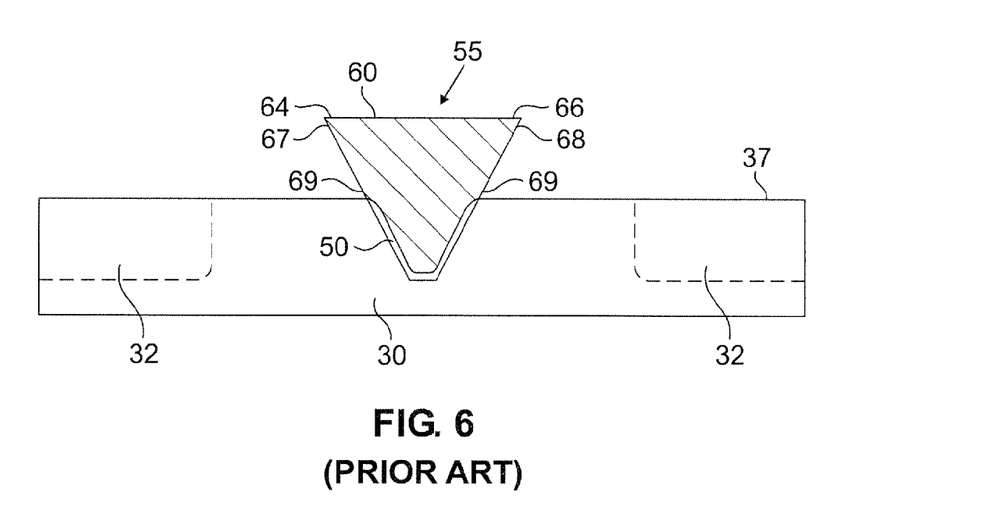

To complete formation of the STI structure 55, the wafer is cleaned, the silicon nitride layer 38 and the pad oxide layer 36 are removed and finally the wafer is cleaned again. FIG. 6 illustrates the structural elements following these processing steps.

As can be seen from FIG. 6, due to the positive taper angle of the sidewalls 47 and 49 (see FIG. 3) the STI structure exhibits a re-entrant profile such that a top left corner 64 and a top right corner 66 together with sidewalls 67 and 68 define an oxide-undercut shape above the surface 37. Further, it is known that conventional cleaning steps following formation of the STI structure 55 may cause additional undercutting in the sidewalls 67 and 68, especially within notch regions 69. The undercut profiles weaken the STI structure 55.

According to subsequent processing steps a gate polysilicon layer is deposited on the surface 37. During this polysilicon deposition, undesired polysilicon stringers can form around the sidewalls 68 and 69 and the left and right corners 64 and 66, creating short circuits that defeat the STI isolation function, thereby degrading performance of the integrated circuit. Thus, a process technology to avoid formation of the polysilicon stringers is highly desired.

According to one technique, to reduce the probability of polysilicon short circuits, it is known to minimize the oxide undercut by reducing a duration of the clean step (typically a hydrofluoric acid clean) that follows removal of the silicon nitride layer 38 and the pad oxide layer 36. However, it is also known that the shorter cleaning step causes material residues and contaminants to remain on the substrate, possibly causing undesirable short circuits or leakage current within the STI structure 55 and the substrate 30.

BRIEF SUMMARY OF THE INVENTION

According to one embodiment, the present invention comprises a method for forming a shallow trench isolation structure in an integrated circuit. The method comprises providing a silicon substrate, forming a sacrificial layer having a graded doped concentration overlying the substrate, etching the sacrificial layer to form an opening therein, wherein sidewalls of the opening present a negative taper angle, etching the substrate in a region below the opening to form a trench therein and forming the shallow trench isolation structure by forming an insulating material in the opening and the trench, wherein the insulating material in the opening exhibits a negative taper angle.

According to another embodiment of the invention, a semiconductor device, comprises a substrate, a device isolation structure formed on the substrate, the device isolation structure further comprising a trench formed within the substrate and an insulating film filling the trench, the insulating film extending above an upper surface of the substrate and presenting a negative taper angle with respect to the substrate

BRIEF DESCRIPTION OF THE DRAWINGS

The present invention can be more easily understood and the advantages and uses thereof more readily apparent when the following detailed description of the present invention is read in conjunction with the figures wherein.

In accordance with common practice, the various described features are not drawn to scale, but are drawn to emphasize specific features relevant to the invention. Reference characters denote like elements throughout the figures and text.

DETAILED DESCRIPTION OF THE INVENTION

Before describing in detail the particular method and apparatus according to the present invention, it should be observed that the present invention resides primarily in a novel and non-obvious combination of elements and process steps. Accordingly, so as not to obscure the disclosure with details that will be readily apparent to those skilled in the art having the benefit of the description herein, in the description that follows, certain elements and process steps have been described with lesser detail, while the drawings and specification describe in greater detail other elements and steps pertinent to understanding the invention. The following embodiments are not intended to define limits as to the structure or use of the invention, but only to provide exemplary constructions. The embodiments are permissive rather than mandatory and illustrative rather than exhaustive.

The process steps and structures described below do not comprise a complete process flow for fabricating integrated circuit devices or a completed device. Only the process steps and structures necessary to understand the present invention are described.

The present invention comprises a technique for forming an STI structure having a negative taper angle above the substrate surface 37, in contrast to the positive taper angle formed according to the prior art processes. A preferred methodology for forming the negative taper angle employs a graded doped sacrificial silicon dioxide layer 70 (see FIG. 7) disposed (e.g., deposited) between a silicon nitride layer 71 and the pad silicon dioxide layer 36. The negative taper angle increases with increasing dopant concentration in the graded doped silicon dioxide layer 70. Additionally, the silicon nitride layer 71, which functions as a CMP stop layer, is thinner according to the present invention than the silicon nitride layer 38 of the prior art process.

Figure 7:
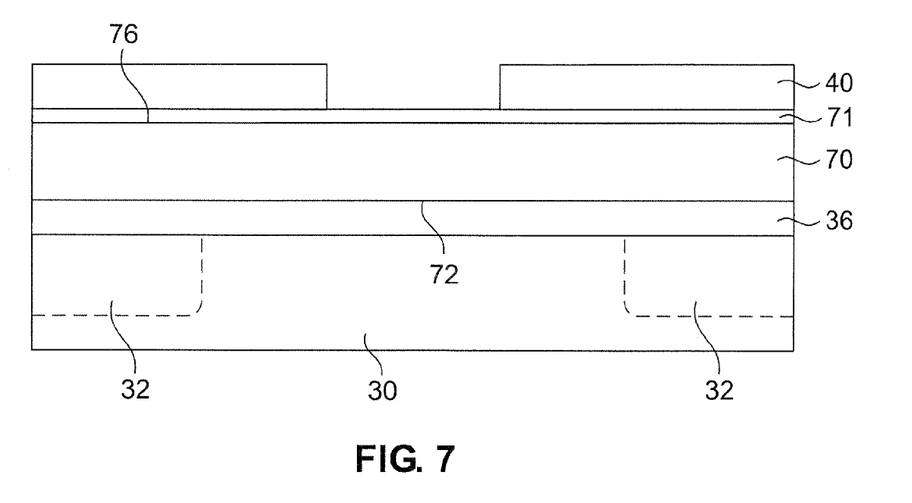
FIG. 7 is a cross-sectional view of a substrate during a processing step to form a shallow trench isolation structure according to the teachings of the present invention.

In one embodiment, the graded doped silicon dioxide layer 70 comprises a layer about 1000 Angstroms thick comprising boron and phosphorous-doped oxide film (e.g., TEOS, plasma-deposited silane, LPCVD-deposited silane). In another embodiment, the layer 70 comprises a layer doped with either boron or phosphorous dopants. According to yet another embodiment, the graded doped oxide layer 70 comprises a plurality of sublayers of different dopant concentrations and/or dopant types.

The graded doped silicon dioxide layer 70 can be doped in situ by introducing a gas or liquid containing the desired dopant into the atmosphere of the deposition chamber. Depending on the desired doping concentration, it may also be possible to dope the layer 70 using an implant doping process.

In an embodiment wherein the graded doped silicon dioxide layer 70 or one or more of the doped sublayers thereof comprises a phosphoborosilicate glass (BPSG) material layer. According to one embodiment, the BPSG material layer can be formed by a low-pressure chemical vapor deposition (LPCVD) process, a plasma CVD process or a sub-atmospheric CVD (SACVD) process. An exemplary SACVD process for depositing the BPSG material layer is performed at about 480 degrees C. and about 200 Torr. The constituent gas flow rates are ozone ($O_3$) at about 4000 sccm and helium at about 6000 sccm. The remaining liquid chemicals and their flow rates are: TEOS (tetraethyl orthosilicate) at about 550 mg/minute, triethylborate (TEB) at about 178 mg/minute and triethylphosphate (TEPO) at about 32 mg/minute. As is known by those skilled in the art, these are merely exemplary sources and recipe parameters, where the latter can be varied by at least +/−10%. Further, these parameters can be varied to achieve different doping densities and in response to process variants.

In an embodiment wherein the graded doped silicon dioxide layer 70 or one or more of the doped sublayers thereof comprises a phosphosilicate glass (PSG) material layer. According to one embodiment, the PSG material layer can be formed by a plasma-enhanced chemical vapor deposition (PECVD) process. An exemplary PECVD process for depositing the PSG material layer is performed at about 480 degrees C. and about 2 Torr with 500 W applied to the plasma chamber. The constituent gas flow rates are oxygen ($O_2$) at about 1400 sccm and helium at about 800 sccm. The liquid chemicals and their flow rates are: TEOS (tetraethyl orthosilicate) at about 800 mg/minute and triethylphosphate (TEPO) at about 18 mg/minute. As is known by those skilled in the art, these are merely exemplary material source and recipe parameters, where the recipe parameters can be varied by at least +/−10% with acceptable results.

Figure 8:
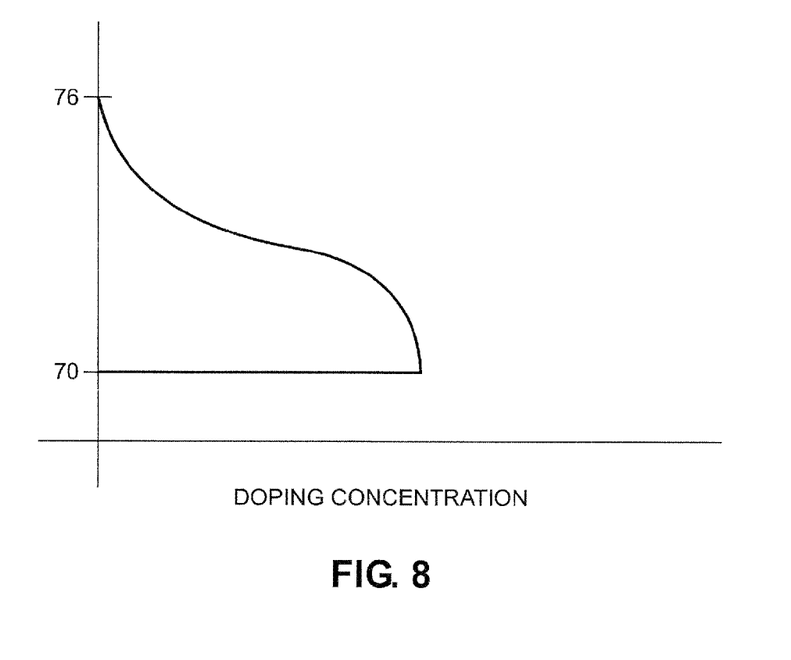
FIG. 8 illustrates a doping profile for the graded doped silicon dioxide layer of the present invention.

A doping concentration of the graded doped silicon dioxide layer 70 decreases from a first concentration (e.g., a maximum dopant concentration) at a surface 72 proximate the pad oxide layer 36, to a second concentration, e.g., a minimum concentration, at a surface 76 proximate the silicon nitride layer 71. A representative doping profile is illustrated in FIG. 8.

According to a preferred embodiment, both the boron and phosphorous doping the concentrations decrease in a direction away from the surface 72 of the layer 70, but the boron and phosphorous dopant concentrations may differ with respect to a slope of the doping concentration curve (the rate at which the doping concentration changes) and a magnitude of the doping concentration at any depth within the layer 70. Both the rate of change of the concentration and the concentration magnitudes can be selected to achieve a desired etch profile for the STI structure. Also, in an embodiment wherein the graded doped silicon dioxide layer 70 comprises a plurality of sublayers, the shape of the doping profile may vary from the representative doping profile of FIG. 8, as each sublayer may have a different doping concentration magnitude and slope as a function of layer depth.

It is known that a phosphorous-doped silicon dioxide layer etches faster than a boron-doped silicon dioxide layer. Further, a phosphorous-doped plus boron-doped silicon-dioxide layer etches faster than a solely phosphorous-doped silicon dioxide layer. Thus the STI etch rate and the STI sidewall profile can be controlled by varying the relative dopant concentrations of phosphorous and boron, the rate at which the concentrations change, the concentration magnitudes within the layer 70 and the thickness of the layer 70.

According to a preferred embodiment, the dopant concentration ranges from about 5% to about 1% for boron and about 5% to about 1% for phosphorous within the graded doped silicon dioxide layer 70. A combined dopant concentration, i.e., boron plus phosphorous, of up to about 10% is permitted, but it may not be desirable for either concentration to exceed about 5%. Thus, for example, a boron concentration of 3% plus a phosphorous concentration of 4% is acceptable, but a boron concentration of 3% plus a phosphorous concentration of 6% may not be desired since the phosphorous concentration exceeds 5%.

As is known in the art, other doping profiles can be created by adjusting the dopant gas concentrations during formation of the graded doped silicon dioxide layer 70. Such other dopant concentrations will affect the etch rate of the layer 70 and thus the taper angle of the STI structure. In particular, if the layer 70 comprises a plurality of differently-doped sublayers having different doping concentrations (and in one embodiment different dopants) each sublayer exhibits a different etch rate, resulting in a different sidewall profile corresponding to each sublayer.

Using the photoresist layer 40 as an etch mask, the opening 46 (see FIG. 9) with the sidewalls 47 is formed in the silicon nitride layer 71.

Figure 9:
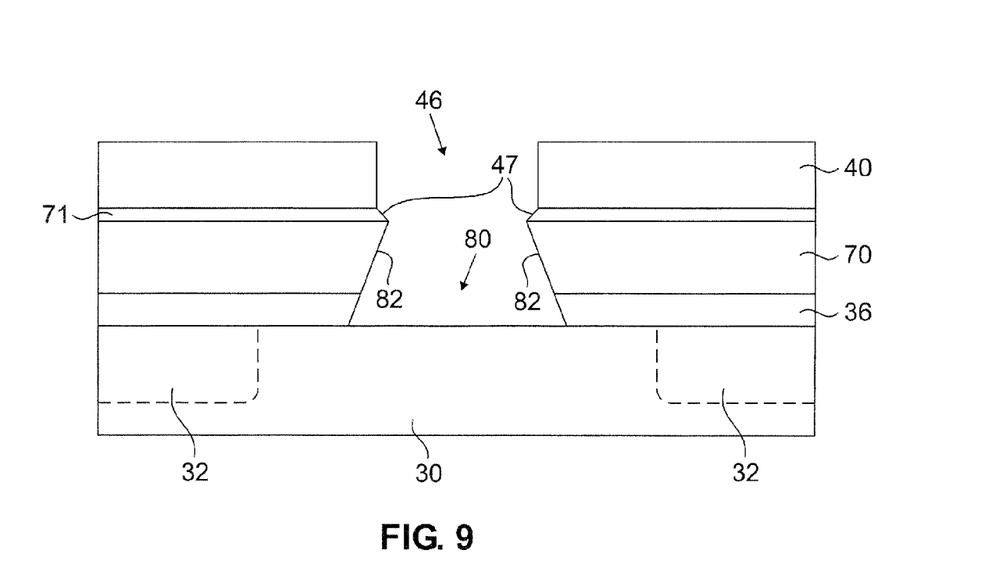
FIGS. 9–12 are cross-sectional views of a substrate during successive processing steps to form a shallow trench isolation structure according to the present invention.

The photoresist layer 40 is removed and using the opening 46 as an etch mask, an opening 80 having negative taper angle sidewalls 82 is formed in the graded doped silicon dioxide layer 70 and the pad oxide layer 36, preferably using a wet etching process. In another embodiment the layer 70 is etched using a plasma etching process.

During etching of the graded doped silicon dioxide layer 70 the sidewall profiles are substantially controlled by the doping of the layer 70. It is known that an etch rate of a doped silicon dioxide material is a direct function of the doping concentration, i.e., the etch rate increases with increasing doping concentration. Thus because the doping concentration increases in a direction toward the pad silicon dioxide layer 36, the etch rate increases with etch duration, forming the sidewalls 82 with a negative taper angle.

Figure 10:
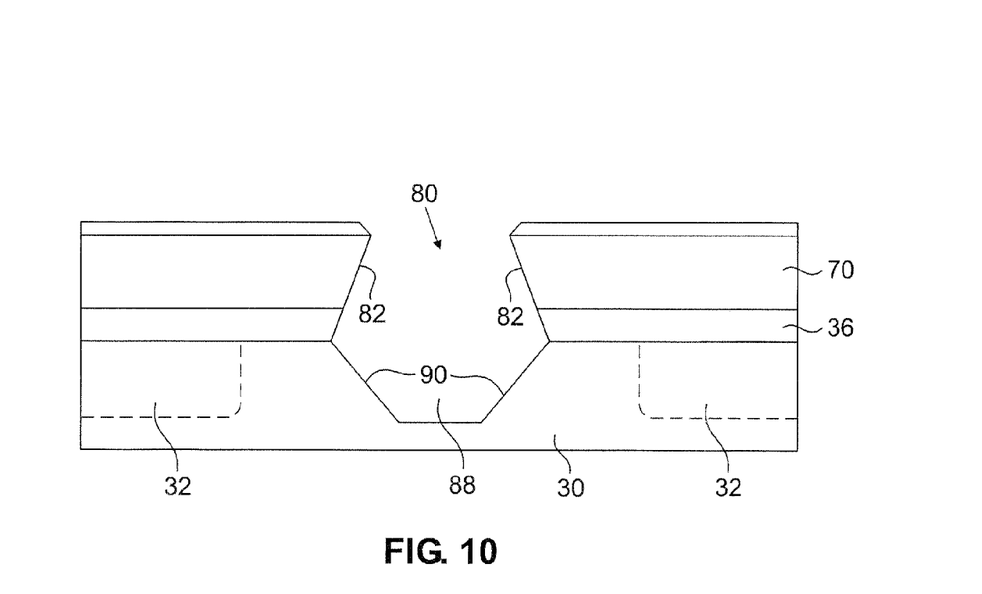

As shown in FIG. 10, according to a subsequent etch process, a trench 88 having positive taper sidewalls 90, is formed in the substrate 30. The substrate etch is terminated after a predetermined etch duration or according to an etch endpoint technique.

The silicon dioxide liner 50 is then formed or deposited in the trench 88. Typically, the liner 50 is formed by oxidizing exposed silicon in the trench 88 to form a high quality silicon dioxide material layer. However, it may be possible to form a suitably high-quality liner 50 by depositing silicon dioxide to form the liner 50.

In another embodiment of the invention, the pad silicon dioxide layer 36 is not etched during etching of the graded doped silicon dioxide layer 70. According to this embodiment the pad silicon dioxide layer 36 is etched during substrate etching.

Figure 11:
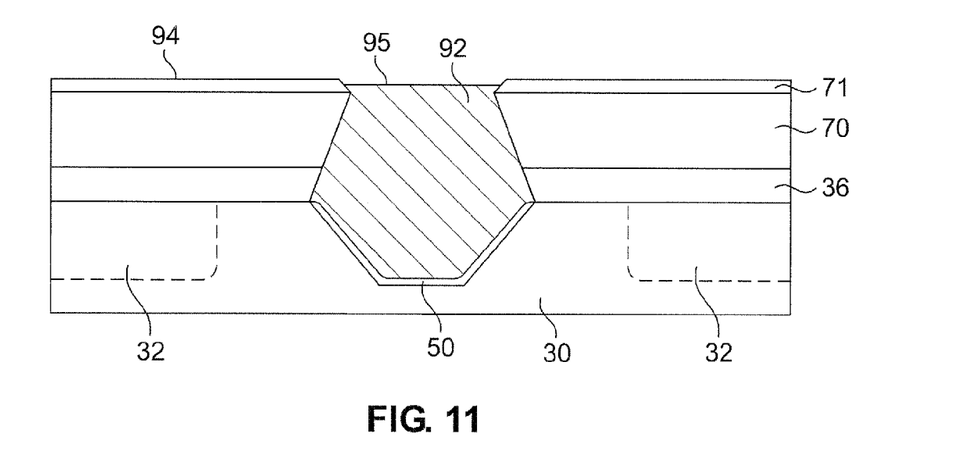

As illustrated in FIG. 11, a shallow trench isolation structure 92 is formed within the trench 88 according to a silicon dioxide deposition step during which silicon dioxide is deposited within the trench 80 and on an upper surface 94 of the silicon nitride layer 71. A CMP step removes silicon dioxide from the upper surface 94, stopping on the silicon nitride layer 71. Since the CMP polishing rate for silicon dioxide is higher than the polishing rate for silicon nitride, an upper surface 95 of the STI structure 92 is recessed below the upper surface 94.

Figure 12:
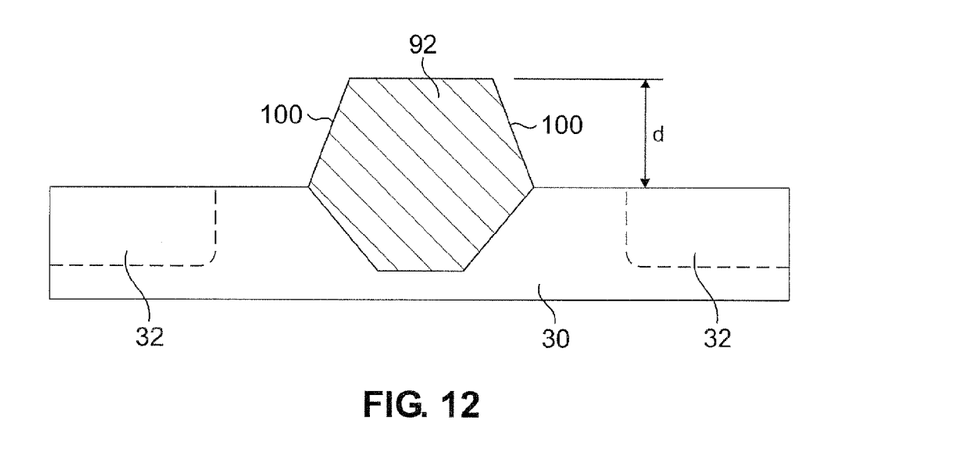

The wafer is cleaned, the silicon nitride layer 71 and the pad silicon dioxide layer 36 are removed and the wafer is cleaned again. See the final structures in FIG. 12. Typically, a distance "d" is about 100–300 Angstroms. Note sidewalls 100 of the STI structure 92 exhibit only a negative taper angle. No regions of positive taper angle or undercuts are present.

However, as can be seen in FIG. 11, when formed in the trench 80, the STI structure 92 may exhibit a slight positive taper angle in a region of the structure 92 adjacent the silicon nitride layer 71. This region is removed by a combination of the CMP step that recesses the surface 95 below the surface 94 and the etching step that removes the silicon nitride layer 71. Thus the final STI structure exhibits only a negative taper angle on the sidewalls 100. In a plan view the STI structure exhibits a square or rectangular shape.

In yet another embodiment (not illustrated) to avoid a possible positive taper angle in the region of the STI structure 92 adjacent the silicon nitride layer 71, the layer 71 is removed prior to forming the STI silicon dioxide in the trench 80, see FIG. 11. Thus the sidewalls 100 do not exhibit any positive taper angle regions or undercuts.

The STI structure 92 formed according to the teachings of the present invention does not exhibit the disadvantageous re-entrant profiles and weak notch regions that are known to occur according to the prior art processes. Therefore, the STI structure 92 avoids the formation of polysilicon stringers and shorts when the polysilicon gate is formed later. By drastically reducing or eliminating the polysilicon shorts and leakage paths, fabrication processes employing the present invention enjoy a higher, more consistent yield and improved device performance.

Figure 13:
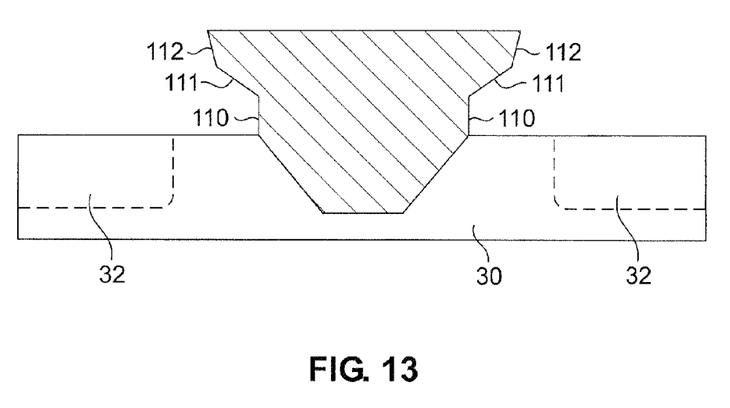
FIG. 13 is a cross-sectional view of a substrate illustrating different sidewall profiles for the shallow trench isolation structure according to another embodiment of the present invention.

By controlling the dopant concentration during formation of the graded doped sacrificial silicon dioxide layer 70, different sidewall profiles can be achieved. See for example, sidewalls 110, 111 and 112 of FIG. 13. Also, if the liner 50 is thicker than a conventional liner, then it may be advantageous to increase the sidewall taper angle by accordingly adjusting the dopant concentration.

The silicon nitride layer 71 preferably comprises a thinner material layer than the silicon nitride layer 38 of the prior art. According to the present invention, a thickness of the silicon nitride layer 71 can be reduced substantially from about 1600 Angstroms to about 500 to about 800 Angstroms since the graded doped silicon dioxide layer 70 can serve as a material stop layer for the chemical mechanical polishing step that removes silicon from the surface 94. A thinner silicon nitride layer imposes less stress on the silicon substrate compared with the thicker silicon nitride layer that is required according to the prior art process. Improved wafer flatness, due to this stress reduction, results in better STI planarization.

An architecture and process have been described as useful for forming STI structure in a semiconductor substrate. Specific applications and exemplary embodiments of the invention have been illustrated and discussed, which provide a basis for practicing the invention in a variety of ways and in a variety of circuit structures. Numerous variations are possible within the scope of the invention. Features and elements associated with one or more of the described embodiments are not to be construed as required elements for all embodiments. The invention is limited only by the claims that follow.

What is claimed is:

1. A method for forming a shallow trench isolation structure in an integrated circuit, the method comprising:
   providing a silicon substrate;
   forming a sacrificial layer having a graded doped concentration overlying the substrate;
   etching the sacrificial layer to form an opening therein, wherein sidewalls of the opening present a negative taper angle;
   etching the substrate in a region below the opening to form a trench therein; and
   forming the shallow trench isolation structure by forming an insulating material in the opening and the trench, wherein the insulating material in the opening exhibits a negative taper angle.

2. The method of claim 1 wherein the step of forming the sacrificial layer further comprises forming the sacrificial layer having a graded doped concentration comprising dopants from the group comprising boron and phosphorous.

3. The method of claim 1 wherein the step of forming the sacrificial layer further comprises forming the sacrificial layer having a graded doped concentration comprising boron dopants and phosphorous dopants.

4. The method of claim 1 wherein the step of forming the sacrificial layer further comprises forming the sacrificial layer having a declining dopant concentration in a direction away from the substrate.

5. The method of claim 1 wherein the step of forming the sacrificial layer further comprises forming the sacrificial layer having a maximum dopant concentration along a surface adjacent the substrate.

6. The method of claim 1 wherein a slope of the negative taper angle is related to the graded doped concentration.

7. The method of claim 1 further comprising selecting a desired negative taper angle and selecting a graded dopant concentration to achieve the desired negative taper angle.

8. The method of claim 1 wherein the step of forming the sacrificial layer further comprises forming the sacrificial layer comprising doped sublayers, wherein the sublayers exhibit a declining dopant concentration in a direction away from the substrate.

9. The method of claim 8 wherein the doped sublayers comprise a number of doped sublayers having numerically different dopant concentrations.

10. The method of claim 8 wherein the doped sublayers comprise a number of doped sublayers comprising different dopant materials.

11. The method of claim 8 wherein a profile of the negative taper angle is responsive to the doped sublayers.

12. The method of claim 7 wherein the doped sublayers comprise boron-doped sublayers and phosphorous-doped sublayers.

13. The method of claim 7 wherein each one of the doped sublayers comprises a boron-doped sublayer or a phosphorous-doped sublayer.

14. The method of claim 1 wherein a profile of the negative taper angle is related to the graded doped concentration.

15. A method for forming a shallow trench isolation structure in an integrated circuit, the method comprising:
   providing a silicon substrate;
   forming a pad oxide layer overlying the silicon substrate;
   forming a sacrificial layer having a graded doped concentration overlying the pad oxide layer;
   forming a silicon nitride layer overlying the sacrificial layer;
   forming a photoresist layer overlying the silicon nitride layer;
   forming a first opening in the photoresist layer;
   using the first opening as a pattern, etching the sacrificial layer and the pad oxide layer to form a second opening therein, wherein sidewalls of the second opening present a negative taper angle;
   etching the substrate in a region below the second opening to form a trench therein; and forming an insulating material in the second opening and the trench, wherein the insulating material in the second opening exhibits a negative taper angle.

16. The method of claim 15 further comprising removing the photoresist layer after forming the second opening.

17. The method of claim 15 further comprising removing the silicon nitride layer, removing the sacrificial layer and removing the pad oxide layer after the step of forming the insulating material.

18. The method of claim 15 further comprising forming a liner in the trench prior to the step of forming the insulating material.

19. The method of claim 15 wherein the step of forming the sacrificial layer further comprises forming the sacrificial layer having a graded doped concentration comprising dopants from the group comprising boron and phosphorous.

20. The method of claim 15 wherein the step of forming the sacrificial layer further comprises forming the sacrificial layer having a graded doped concentration comprising boron dopants and phosphorous dopants.

21. The method of claim 15 wherein the step of forming the sacrificial layer further comprises forming the sacrificial layer having a declining dopant concentration in a direction away from the substrate.

22. The method of claim 15 wherein the step of forming the sacrificial layer further comprises forming the sacrificial layer having a maximum dopant concentration along a surface adjacent the substrate.

23. The method of claim 15 wherein a slope of the negative taper angle is related to the graded doped concentration.

24. The method of claim 15 further comprising selecting a desired negative taper angle and selecting a graded dopant concentration to achieve the desired negative taper angle.

25. The method of claim 15 wherein the step of forming the silicon nitride layer further comprises forming a silicon nitride layer having a thickness of about 500 to about 800 Angstroms.

* * * * *